US005600131A

United States Patent [19]
Miura

[11] Patent Number: 5,600,131
[45] Date of Patent: Feb. 4, 1997

[54] PHOTODETECTING DEVICE WITH SIMPLE INTERCONNECTION BETWEEN A PHOTODETECTOR AND A FLEXIBLE PRINTED WIRING BOARD

[75] Inventor: Masafumi Miura, Tokyo, Japan

[73] Assignee: NEC Corporation, Tokyo, Japan

[21] Appl. No.: 637,487

[22] Filed: Apr. 24, 1996

[30] Foreign Application Priority Data

Apr. 28, 1995  [JP]  Japan .................... 7-128897

[51] Int. Cl.⁶ .................... H01L 31/0203
[52] U.S. Cl. .................... 250/214.1; 257/433
[58] Field of Search ............ 250/214.1, 214 R; 257/431, 432, 433, 434, 459, 460; 385/92, 93, 94

[56] References Cited

U.S. PATENT DOCUMENTS

| | | | |
|---|---|---|---|
| 3,963,920 | 6/1976 | Palmer | 250/214.1 |
| 4,623,220 | 11/1986 | Grabbe et al. | 385/92 |
| 5,317,195 | 5/1994 | Ishikawa et al. | 257/433 |
| 5,436,997 | 7/1995 | Makiuchi et al. | 385/94 |

FOREIGN PATENT DOCUMENTS 4-62507  5/1992  Japan .

*Primary Examiner*—Edward P. Westin
*Assistant Examiner*—Kevin Pyo
*Attorney, Agent, or Firm*—Laff, Whitesel, Conte & Saret, Ltd.

[57] ABSTRACT

A photodetecting device for use in an optical head comprises a photodetector (20) having a body portion (21) at one surface of which a light receiving surface (21a) is provided and a plurality of lead portions (22) each extending outwardly from the other surface of the body portion (21), and, a metallic substrate (10) having a through hole (12) and a plurality of electrically conductive land portions (13) formed on a first surface of the metallic plate (10) via an insulating layer (11). The lead portions (22) of the photodetector (20) are bent toward the substrate (10). An end portion of the lead portion (22) is connected to the land portion (13). The photodetector (20) is disposed so that the light receiving surface (21a) faces the through hole (12) and a light from the optical head (H) on which a second surface of the substrate (10) is joined arrives at the light receiving surface (21a) through the through hole (12).

10 Claims, 5 Drawing Sheets

F I G. 3A
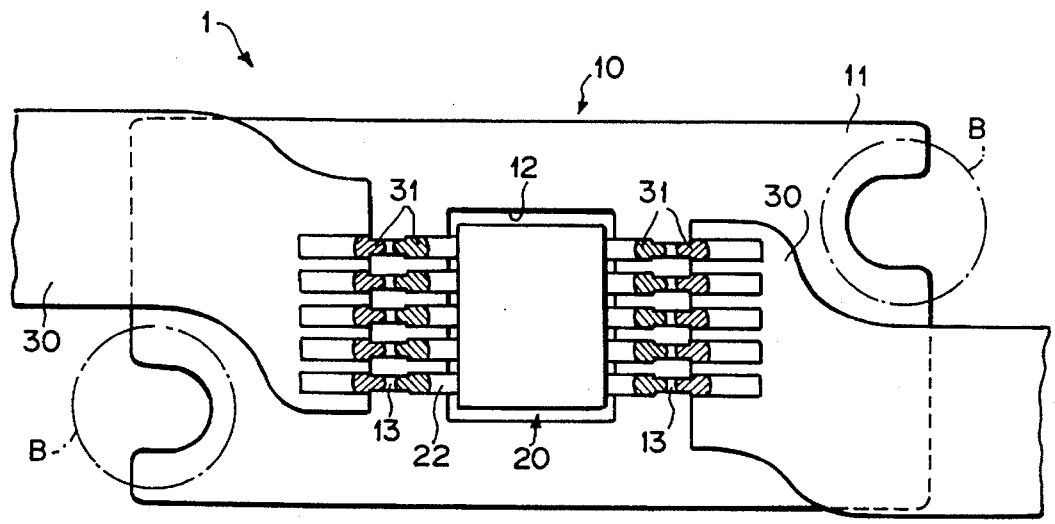
F I G. 3B
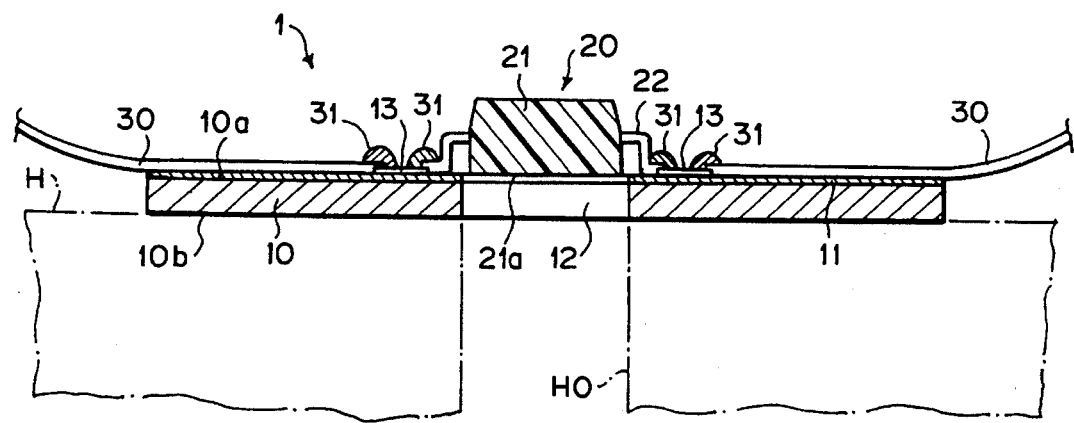

F I G. 5
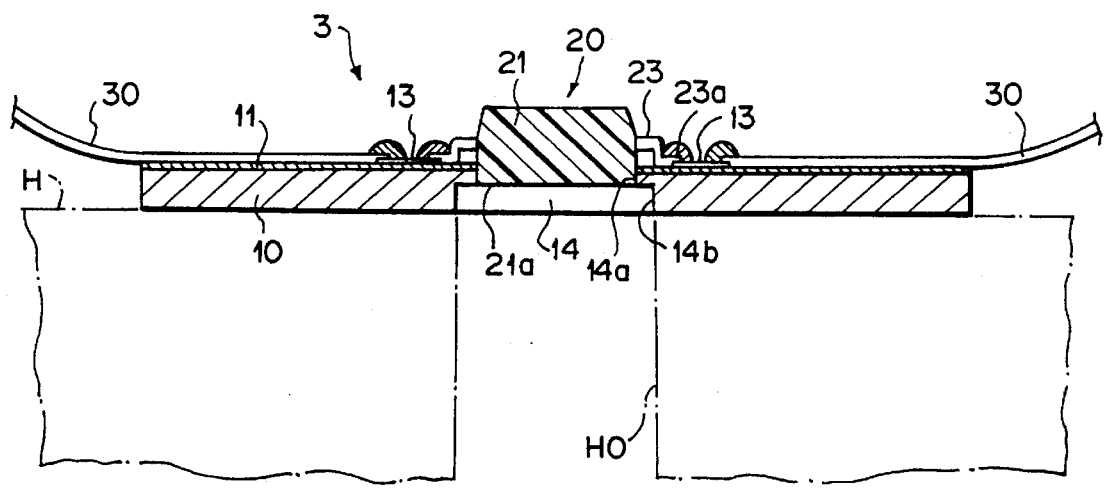
F I G. 6
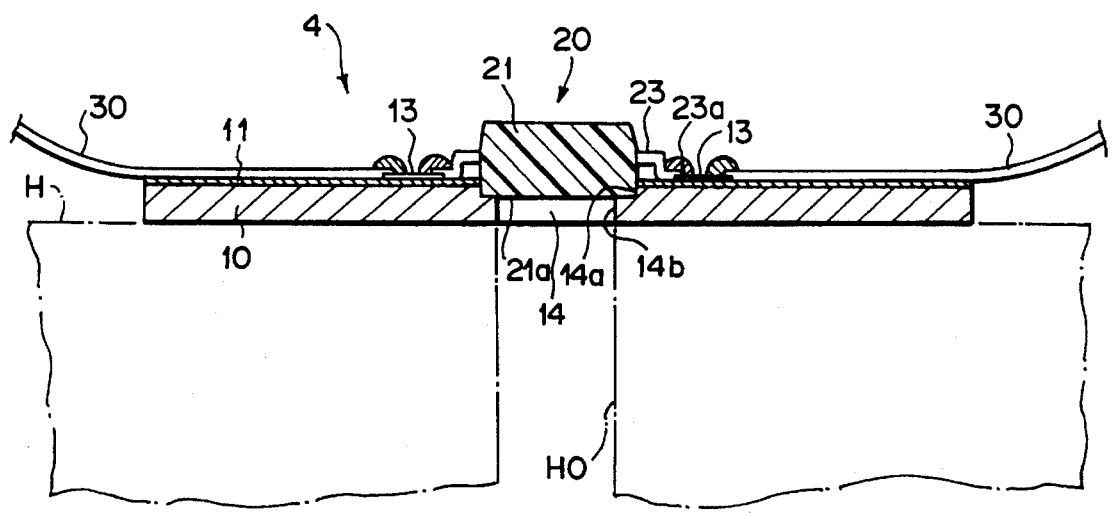

PHOTODETECTING DEVICE WITH SIMPLE INTERCONNECTION BETWEEN A PHOTODETECTOR AND A FLEXIBLE PRINTED WIRING BOARD

FIELD OF THE INVENTION

The present invention relates to a photodetecting device which is used in an optical head which performs the reading of the information recorded or stored in an optical disk and the focusing and tracking controls.

BACKGROUND OF THE INVENTION

The conventional photodetecting device comprises a photodetector, a flexible printed wiring board for transmitting the output from the photodetector and a metallic substrate for supporting the photodetector and the flexible printed wiring board.

For example, FIGS. 1A and 1B illustrate a first conventional photodetecting device. FIG. 1A is a plan view of the device and FIG. 1B is a side view of the same.

In these figures, 110 denotes a metallic substrate, one surface of which serves as the surface joined to an optical head (not shown). On this surface, an insulating layer 111 is formed, on which a first land portion 112 and a second land portion 113 are formed.

Here, in order to prevent the interference between the optical head and the first and second land portions 112, 113, a predetermined interval is provided between the first land portion 112 and the second land portion 113, which are interconnected by means of a wiring pattern 114.

A photodetector 120 is mounted on the first land portion 112, and a flexible printed wiring board 130 is connected to the second land portion 113. The photodetector 120 has a light receiving surface at a top surface thereof.

Further, FIGS. 2A, 2B and 2C illustrate a second conventional photodetecting device. FIG. 2A is a plan view of the device, FIG. 2B is a side view of the same and FIG. 2C is a bottom view of the same.

In these figures, 210 denotes a metallic substrate, one surface of which serves as the surface joined to an optical head (not shown). On both surfaces of the substrate, an insulating layer 211 is formed. On the insulating layer 211 formed on the one surface of the metallic substrate 210 a first land portion 212 is formed. A photodetector 220 having a light receiving surface at a top surface thereof is mounted on the first land portion 212.

Further, on the insulating layer 211 formed on the other surface of the metallic substrate 210, a second land portion 213 is formed, and a flexible printed wiring board 230 is connected to the second land portion 213. The first land portion 212 and the second land portion 213 are interconnected by means of a through hole 214.

However, in the foregoing first and second conventional photodetecting devices, since the photodetectors 120, 220 are mounted on the insulating layers 111, 211 with which the optical head is in contact, a considerable constraint is posed on the position and size of the first land portions 112, 212 in order to improve the fit of the optical head on the device and prevent the electrical interruption such as short-circuit with the result that the photodetectors 120, 220 and the flexible printed wiring boards 130, 230 cannot be interconnected with a simple arrangement.

Further, in the first conventional photodetecting device, since the photodetector 120 and the flexible printed wiring board 130 are disposed on the surface with which the optical head is in contact, it is necessary to prevent the interference between the optical head and the flexible printed wiring board 130 during joining the former to the device.

As a result, an interval should be provided between the photodetector 120 and the flexible printed wiring board 130 to interconnect them by means of the wiring pattern 114 with the result that the area of the metallic substrate 110 is increased and the entire device is made greater.

On the other hand, in the second conventional photodetecting device, since the photodetector 220 and the flexible printed wiring board 230 are mounted on the metallic substrate 210 at a side distinct from each other, it is necessary to form the through hole 214 to make an interconnection between those.

However, in the interconnection by the through hole 214, a certain limit is posed in narrowing the distance between the adjacent first land portions 212 or the adjacent second land portions 213, and the arrangement of the device becomes complicated.

Incidentally, in Japanese Utility Model Application Laid-open No. 4-62507, a photodetecting device is proposed in which a through hole adapted for allowing the light to pass through is formed at the central portion of a substrate which has a resilient arm portion at its end portion, and a photodetector is mounted on the substrate at a position corresponding to the through hole, the resilient arm portion being fixed to an optical head by means of a screw, so that the photodetector is made movable in the direction of the optical axis by the adjustment of the screw.

However, in this photodetecting device, since the photodetector is mounted on the substrate and connected to a land portion without bending its lead portion which extends along the surface of the substrate, if the substrate is formed with metal, then the distance between the lead portion and the metallic portion of the substrate which is exposed at the inner wall portion of the through hole is so close that the electrical interruption such as short-circuit is caused.

SUMMARY OF THE INVENTION

The present invention was conceived in view of the foregoing problems, and an object of the present invention is to provide a photodetecting device which allows the photodetector and the flexible printed wiring board to be interconnected with a simple arrangement while being improved in the fit of the optical head on the device and in the prevention of the electrical interruption such as short-circuit through the improvement of the insulating property and being small in size due to the reduction of area of the substrate.

In order to achieve the foregoing object, there is provided an photodetecting device comprising:
  a photodetector having a body portion at one surface of which a light receiving surface is provided and a plurality of lead portions each extending outwardly from the other surface of the body portion; and
  a substrate having a through hole and a first surface on which a plurality of electrically conductive land portions are formed,
  wherein the lead portions of the photodetector are bent toward the substrate, an end portion of the lead portions is connected to the land portions, and the photodetector is disposed so that the light receiving surface faces to the through hole and a light from an optical head on which a second surface of the substrate is joined arrives at the light receiving surface through the through hole.

In an aspect of the present invention, the end portion of the lead portions is further bent in a direction parallel to the one surface of the body portion of the photodetector.

In an aspect of the present invention, the end portion of the lead portions is connected to the land portions by soldering.

In an aspect of the present invention, a flexible wiring board is connected to the land portions.

In an aspect of the present invention, the through hole has such a form and size that the body portion of the photodetector fits an inner wall portion of the through hole, and the lead portions are positioned as corresponding to the land portions when the body portion is positioned at the through hole.

In an aspect of the present invention, the through hole has a step in an inner wall portion thereof.

In an aspect of the present invention, the through hole has a first portion at a side of the first surface and a second portion at a side of the second surface, the second portion having an inner diameter greater than that of the first portion so as to form the step.

In an aspect of the present invention, the through hole has a first portion at a side of the first surface and a second portion at a side of the second surface, the first portion having an inner diameter greater than that of the second portion so as to form the step.

In an aspect of the present invention, a position of the photodetector in a direction of thickness of the substrate is set by putting the body portion of the photodetector on the step.

In an aspect of the present invention, the substrate is made of a metal sheet and the land portions are formed on the metal sheet via an insulating layer.

In the photodetecting device according to the present invention, one of the surfaces of the substrate serves as the surface on which the photodetector and the flexible wiring board are to be disposed, and the other serves as the surface to which the optical head is joined. Further, through the through hole formed through the substrate, the light reflected by the optical disk is incident to the light receiving surface of the photodetector to perform the reading of the information and the like.

That is, since the photodetector and the flexible wiring board can be disposed on the surface opposite to the surface to which the optical head is joined, these can be interconnected with a simple arrangement. Also, the fit of the device on the optical head can be improved, the electrical interruption such as short-circuit can be prevented through the improvement of the insulating performance and the size reduction of the device through the reduction of the substrate area can be realized.

Further, the insulating performance between the lead portion and the metallic substrate can be further improved and the electrical disturbance such as short-circuit or the like can be prevented more reliably by employing the lead potion of the photodetector bent toward the substrate.

In the photodetecting device according to an aspect of the present invention, when the device is assembled, the body portion or package of the photodetector is made to engage the through hole so that each lead portion of the photodetector can readily be positioned on each land portion of the substrate.

BRIEF DESCRIPTION OF THE DRAWINGS

FIG. 3A is a plan view of the photodetecting device according to a first embodiment of the present invention, and FIG. 3B is a cross-sectional view of the same;

FIGS. 5 and 6 are each a cross-sectional view showing the photodetecting device according to the third and fourth embodiments of the present invention, respectively.

DESCRIPTION OF THE PREFERRED EMBODIMENTS

Figure 1A:
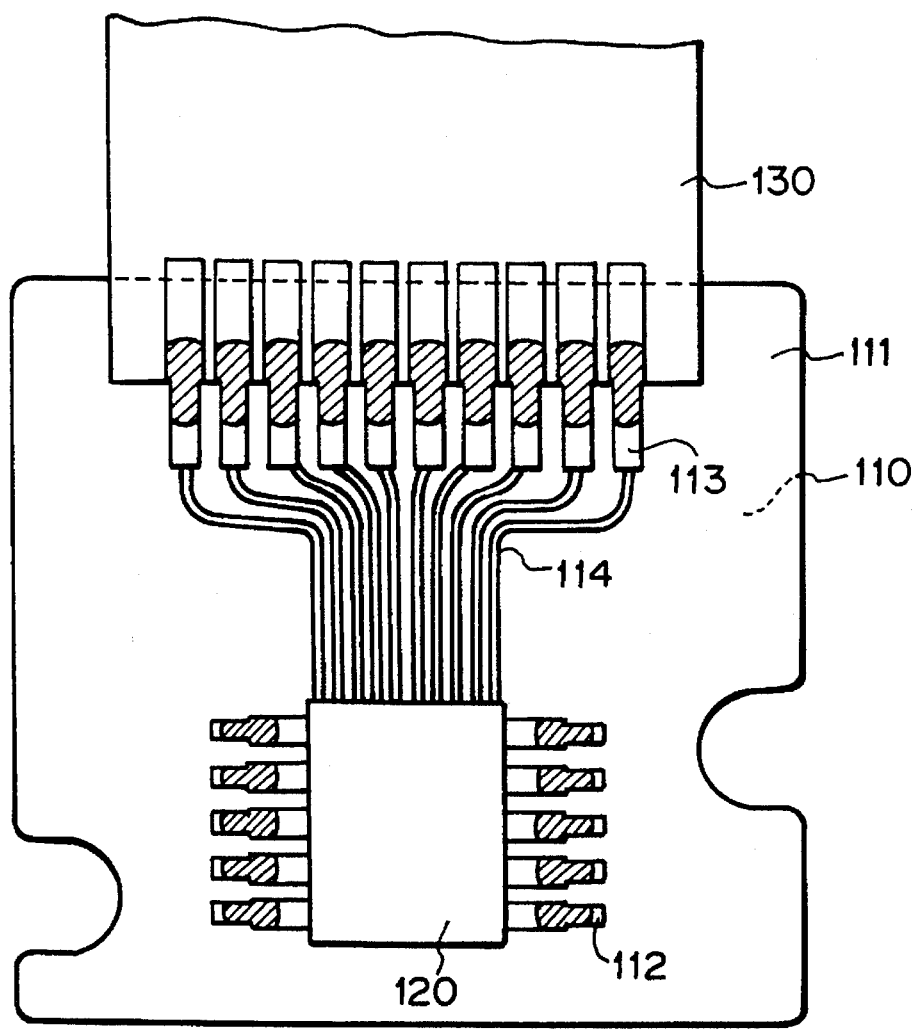
FIG. 1A is a plan view of the first conventional photodetecting device and FIG. 1B is a side view of the same.
Figure 1B:
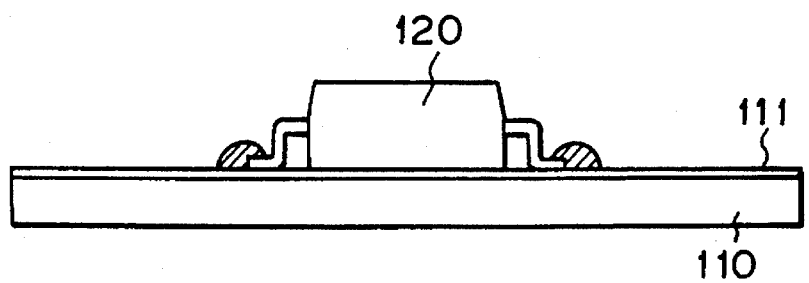
Figure 2A:
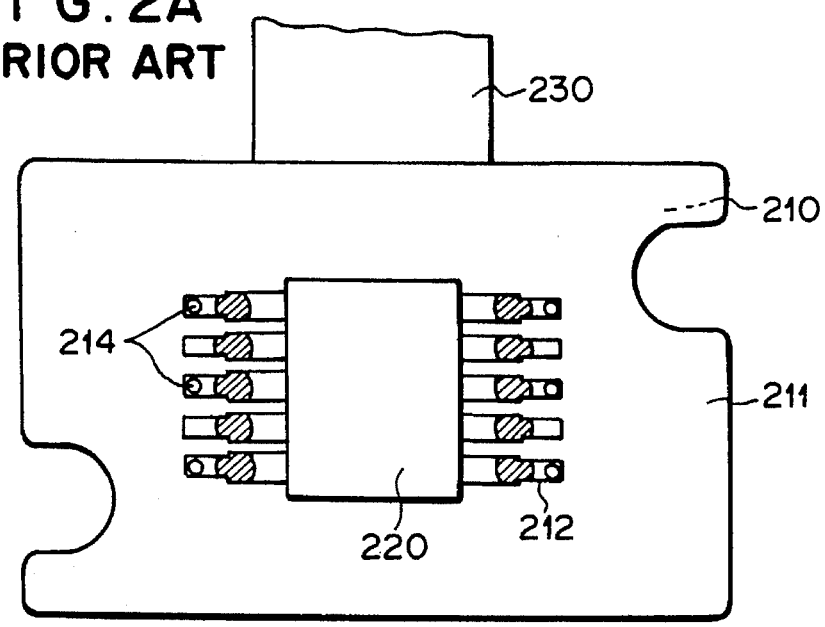
FIG. 2A is a plan view of the second conventional photodetecting device.
Figure 2B:
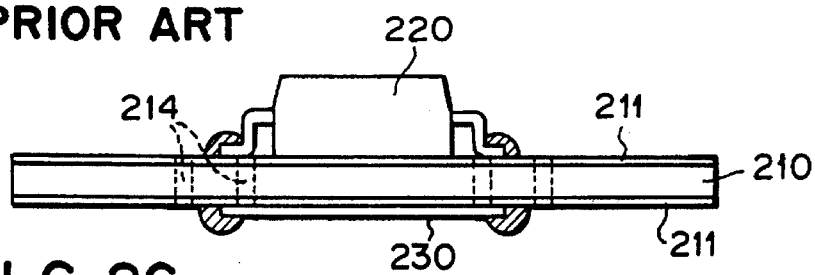
FIG. 2B is a side view of the same and FIG. 2C is a bottom view of the same.
Figure 2C:
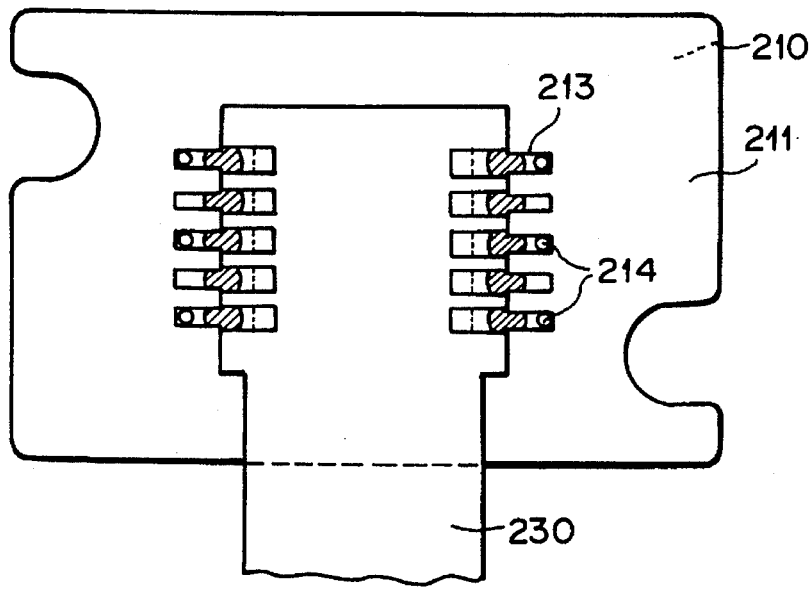

Several embodiments of the photodetecting device according to the present invention are hereinafter described with reference to the drawings.

First, a photodetecting device according to a first embodiment of the present invention is described.

FIGS. 3A and 3B show the photodetecting device according to the first embodiment of the present invention, and FIG. 3A is a plan view and FIG. 3B is a cross-sectional view.

As can be seen in these figures, in the photodetecting device 1 according to this embodiment, a photodetector 20 and a flexible printed wiring board 30 are disposed at an upper surface side of a metallic substrate 10.

As shown in FIG. 3B, an insulating layer 11 is formed on the upper surface 10a of the metallic substrate 10, and a through hole 12 is provided at the center of the metallic substrate 10. The through hole 12 is positioned as corresponding to a body portion or package 21 of the photodetector 20 and has a shape corresponding to and a size somewhat greater than that of the body portion 21.

Further, as shown in FIG. 3A, a plurality of land portions 13 are formed on the insulating layer 11 at both sides of the through hole 12 to interconnect a lead portion 22 of the photodetector 20 and a flexible printed wiring board 30. Reference numeral 31 denotes a solder.

On the other hand, a lower surface 10b of the metallic substrate 10 serves as the surface to which an optical head H is joined by means of, for example, a bolt, a head B of which is described in FIG. 3A.

The photodetector 20 comprises the body portion 21 of rectangular parallelepiped and the plurality of lead portions 22 extending in the opposite directions from lateral surfaces of the body portion 21.

As shown in FIG. 3B, a lower surface of the body portion 21 serves as a light receiving surface 21a onto which the light reflected by an optical disk (not shown) is incident through an opening HO of the head H. The body portion 21 has a functional electronic circuit for detecting the light received and generating an electrical output signal depending on the light to be supplied to the lead portions 22. The photodetector 20 is mounted on the metallic substrate 10 so that the light receiving surface 21a faces the through hole 12.

Further, the lead portions 22 are each bent downwardly at a right angle and an end portion of each lead portions 22 is bent outwardly at a right angle in order to be insulated from the metallic substrate 10 which is exposed at the inner wall portion of the through hole 12.

In the photodetecting device 1 according to the present embodiment arranged as above, the lower surface 10b of the metallic substrate 10 is joined to the optical head H, and the reflected light from the optical disk is made incident on the light receiving surface 21a of the photodetector 20 through the opening H0 and the through hole 12 to perform the reading of the information or the like.

In such a photodetecting device 1 of the first embodiment, since both the photodetector 20 and the flexible printed wiring board 30 can be mounted on the surface opposite to the surface to which the optical head H is joined, each lead portion 22 of the photodetector 20 and the flexible printed wiring board 30 can be directly interconnected on the common land portion 13 by soldering.

Further, since the surface 10b of the metallic substrate 10 is used only as the surface to which the optical head II is joined, the fit of the device on the optical head H can be improved, the electrical interruption such as short-circuit can be prevented through the improvement of the insulating performance and the size reduction of the device through the reduction of the substrate area can be realized.

Further, by using the lead portion 22 of the photodetector 20 bent downwardly so that the lead portion 22 is positioned away from the through hole 12, the insulating performance between the lead portion 22 and the metallic portion of the substrate 10 which is exposed at the inner wall portion of the through hole 12 can be further improved to prevent the electrical disturbances such as short-circuit more reliably.

Next, a photodetecting device according to a second embodiment of the present invention is described.

Figure 4A:
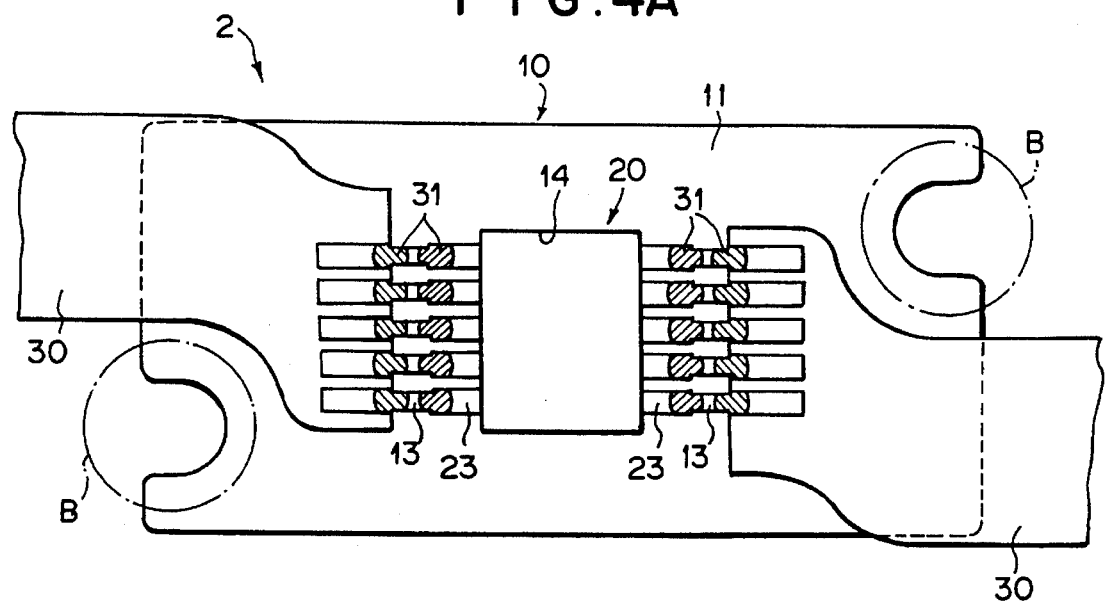
FIG. 4A is a plan view of the photodetecting device according to a second embodiment of the present invention.
Figure 4B:
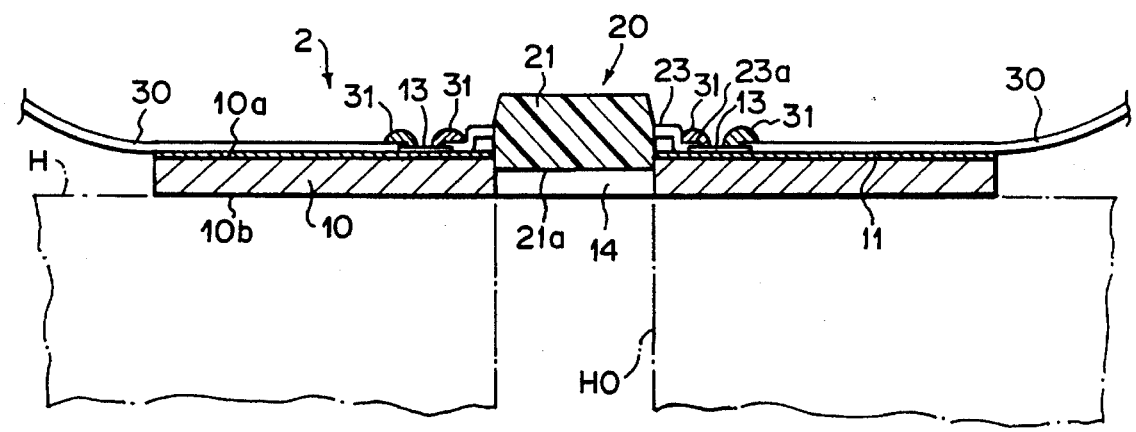
FIG. 4B is a cross-sectional view of the same.

FIGS. 4A and 4B show the photodetecting device according to the second embodiment of the present invention, and FIG. 4A is a plan view and FIG. 4B is a cross-sectional view.

As can be seen in these figures, in the photodetecting device 2 according to this embodiment, a photodetector 20 and a flexible printed wiring board 30 are disposed at an upper surface side of a metallic substrate 10.

As shown in FIG. 4B, an insulating layer 11 is formed on the upper surface 10a of the metallic substrate 10, and a through hole 14 is provided at the center of the metallic substrate 10. The through hole 14 is positioned as corresponding to a body portion 21 of the photodetector 20.

Further, as shown in FIG. 4A, a plurality of land portions 13 are formed on the insulating layer 11 at both sides of the through hole 14 to interconnect a lead portion 23 of the photodetector 20 and a flexible printed wiring board 30. Reference numeral 31 denotes a solder.

On the other hand, a lower surface 10b of the metallic substrate 10 serves as the surface to which an optical head H is joined by means of, for example, a bolt, a head B of which is described in FIG. 4A.

The photodetector 20 comprises the body portion 21 of rectangular parallelepiped and the plurality of lead portions 23 extending in the opposite directions from lateral surfaces of the body portion 21.

As shown in FIG. 4B, a lower surface of the body portion 21 serves as a light receiving surface 21a onto which the light reflected by an optical disk (not shown) is incident through an opening H0 of the head H. The body portion 21 has a functional electronic circuit for detecting the light received and generating an electrical output signal depending on the light to be supplied to the lead portions 23. The photodetector 20 is mounted on the metallic substrate 10 so that the light receiving surface 21a faces the through hole 14.

Further, the lead portions 23 are each bent downwardly at a right angle and an end portion of each lead portions 23 is bent outwardly at a right angle in order to be insulated from the metallic substrate 10 which is exposed at the inner wall portion of the through hole 14.

The through hole 14 is formed in the same form and size as that of the body portion 21 of the photodetector 20, and each lead portion 23 of the photodetector 20 is bent outwardly at a level higher than that of the light receiving surface 21a. If the lower part lateral wall portion of the body portion 21 is engaged with the through hole 14, then an end portion 23a of each lead portion 23 is made to correspond to each land portion 13 respectively.

In the photodetecting device 2 according to the present embodiment arranged as above, the lower surface 10b of the metallic substrate 10 is joined to the optical head H, and the reflected light from the optical disk is made incident on the light receiving surface 21a of the photodetector 20 through the opening H0 and the through hole 14 to perform the reading of the information or the like.

In such a photodetecting device 2 of the first embodiment, since both the photodetector 20 and the flexible printed wiring board 30 can be mounted on the surface opposite to the surface to which the optical head H is joined, each lead portion 23 of the photodetector 20 and the flexible printed wiring board 30 can be directly interconnected on the common land portion 13 by soldering.

Further, since the surface 10b of the metallic substrate 10 is used only as the surface to which the optical head H is joined, the fit of the device on the optical head H can be improved, the electrical interruption such as short-circuit can be prevented through the improvement of the insulating performance and the size reduction of the device through the reduction of the substrate area can be realized.

Further, by using the lead portion 23 of the photodetector 20 bent downwardly so that the lead portion 23 is positioned away from the through hole 14, the insulating performance between the lead portion 23 and the metallic portion of the substrate 10 which is exposed at the inner wall portion of the through hole 14 can be exposed at the inner wall portion of the through hole 14 can be further improved to prevent the electrical disturbances such as short-circuit more reliably.

In the photodetecting device 2 arranged as above, when the device is assembled, the connecting end portion 23a of each lead portion 23 can be readily positioned to each land portion 13 by engaging the body portion 21 of the photodetector 20 with the through hole 14 so that the easy assembling can be realized.

Incidentally, although, in the foregoing second embodiment, the entire through hole 14 is formed in the same form as that of the body portion 21, the same effect can be achieved even if only the upper portion of the through hole 14 is formed in the same form as that of the body portion 21.

FIGS. 5 and 6 are each a cross-sectional view showing the photodetecting device according to the third and fourth embodiments of the present invention, respectively.

As can be seen in FIG. 5, in the photodetecting device 3 according to the third embodiment, the through hole 14 has a step in the inner wall portion thereof. That is, the through hole 14 has a first portion 14a at an upper part and a second portion 14b at a lower part and the second portion 14b has an inner size $D_2$ greater than an inner size $D_1$ of the first portion 14a so as to form the step.

As can be seen in FIG. 6, in the photodetecting device 4 according to the fourth embodiment, the through hole 14 has a step in the inner wall portion thereof. That is, the through hole 14 has a first portion 14a at an upper part and a second portion 14*b* at a lower part and the first portion 14*a* has an inner size $D_1$ greater than an inner size $D_2$ of the second portion 14*b* so as to form the step.

In the above third and fourth embodiments, the first portion 14*a* of the through hole 14 is formed in the same form and size as that of the body portion 21 of the photodetector 20, and each lead portion 23 of the photodetector 20 is bent outwardly at a level higher than that of the light receiving surface 21*a*. If the lower part of the lateral wall portion of the body portion 21 is engaged with the through hole 14, then an end portion 23*a* of each lead portion 23 is made to correspond to each land portion 13 respectively.

In the above fourth embodiment, a position of the photodetector 20 in a direction of thickness of the substrate 10 is set by putting the body portion of the photodetector 20 on the step.

What is claimed is:

1. A photodetecting device comprising:

a photodetector having a body portion at one surface of which a light receiving surface is provided and a plurality of lead portions each extending outwardly from a side surface of said body portion; and a substrate having a through hole and a first surface on which a plurality of electrically conductive land portions are formed, wherein said lead portions of the photodetector are bent toward said substrate, an end portion of said lead portions is connected to said land portions, and said photodetector is disposed so that said light receiving surface faces to said through hole and a light from an optical head on which a second surface of said substrate is joined arrives at said light receiving surface through said through hole.

2. A photodetecting device as set forth in claim 1, wherein said end portion of the lead portions is further bent in a direction parallel to said one surface of the body portion of the photodetector.

3. A photodetecting device as set forth in claim 1, wherein said end portion of the lead portions is connected to said land portions by soldering.

4. A photodetecting device as set forth claim 1, wherein a flexible wiring board is connected to said land portions.

5. A photodetecting device as set forth in claim 1, wherein said through hole has such a form and size that said body portion of the photodetector fits an inner wall portion of said through hole, and said lead portions are positioned as corresponding to said land portions when said body portion is positioned at said through hole.

6. A photodetecting device as set forth in claim 1, wherein said through hole has a step in an inner wall portion thereof.

7. A photodetecting device as set forth in claim 6, wherein said through hole has a first portion at a side of said first surface and a second portion at a side of said second surface, said second portion having an inner size greater than that of said first portion so as to form said step.

8. A photodetecting device as set forth in claim 6, wherein said through hole has a first portion at a side of said first surface and a second portion at a side of said second surface, said first portion having an inner size greater than that of said second portion so as to form said step.

9. A photodetecting device as set forth in claim 8, wherein a position of said photodetector in a direction of thickness of said substrate is set by putting said body portion of the photodetector on said step.

10. A photodetecting device as set forth in claim 1, wherein said substrate is made of a metal sheet and said land portions are formed on said metal sheet via an insulating layer.

* * * * *